(12) United States Patent
Chowdhury et al.

(10) Patent No.: US 6,642,867 B1
(45) Date of Patent: Nov. 4, 2003

(54) REPLICA COMPENSATED HETEROGENEOUS DACS AND METHODS

(75) Inventors: Rahim Chowdhury, Saratoga, CA (US); Bo Yang, San Jose, CA (US); David Castaneda, Morgan Hill, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/188,897

(22) Filed: Jul. 3, 2002

(51) Int. Cl.[7] ............................................... H03M 1/06
(52) U.S. Cl. .................................... 341/118; 341/144
(58) Field of Search ................................ 341/118, 143, 341/144, 120, 150, 153

(56) References Cited

U.S. PATENT DOCUMENTS 6,535,154 B1 * 3/2003 Sculley ....................... 341/143
6,556,161 B2 * 4/2003 Nuijten ....................... 341/118

* cited by examiner

Primary Examiner—Brian Young
(74) Attorney, Agent, or Firm—Blakely, Sokoloff, Taylor & Zafman LLP

(57) ABSTRACT

Digital to analog converters having a hybrid two-stage structure. The first stage is a differential segmented current DAC controlled by the MSBs (most significant bits) of input data. The second stage is a resistor string DAC controlled by the LSBs (least significant bits) of the input data to interpolate between the differential outputs of the first stage. The resistor string is directly connected to the current DAC without the need of buffer amplifiers. Instead, a replica circuit is used to prevent the second-stage resistor string from loading the first stage current DAC. Compensation techniques are described.

39 Claims, 4 Drawing Sheets

US 6,642,867 B1

REPLICA COMPENSATED HETEROGENEOUS DACS AND METHODS

BACKGROUND OF THE INVENTION

1. Field of the Invention

The present invention relates to the field of digital-to-analog converters (DACs).

2. Prior Art

Digital-to-analog converters (DACs), used to convert digital signals to an analog voltage or current, are widely used to couple digital controllers of various types to devices responsive to analog signals. Various types of DACs are well known, with each having its own combination of strengths and weaknesses in terms of cost and performance. At the present time, there is a growing need for high-resolution DACs, e.g., 16-bit DACs. In some applications of high resolution DACs, good differential linearity and guaranteed monotonic behavior are more important than absolute accuracy. Such applications include control loops, wherein an analog response of the analog controlled parameter is digitized, processed for control purposes, and converted by a DAC to analog form to control the desired parameter by way of the closed loop. Here accuracy is provided by the closed loop itself, but resolution, stability and fast settling of the loop require the good differential linearity and monotonic behavior. Normally R-2R DACs and segment-type DAC are used for such high resolution DACs.

The resolution of untrimmed R-2R DACs is normally limited to 12–14 bits using present processing technology. If R-2R DACs are used for higher resolution purposes, they need a lot of trimming to guarantee monotonicity, making the cost of high resolution R-2R DACs very high. As for segment-type DACs, they are usually composed of strings of series-connected resistors with buffer amplifiers to prevent the second-stage resistor string from loading the first-stage resistor string. However the buffer amplifiers increase the die size and require a larger power supply. They also are sources of linearity errors.

BRIEF SUMMARY OF THE INVENTION

The present invention is particularly suited for low cost and high-resolution digital-to-analog converters. The converters in accordance with the invention have a hybrid two-stage structure. The first stage is a differential segmented current DAC controlled by the MSBs (most significant bits) of input data. The second stage is a resistor string DAC controlled by the LSBs (least significant bits) of the input data to interpolate between the differential outputs of the first stage. The resistor string is directly connected to the current DAC without the need of buffer amplifiers. Instead, a replica circuit is used to prevent the second-stage resistor string from loading the first stage current DAC. Compared with prior art architectures, the invention has a simple structure, which only requires a small die area and needs a reduced number of trims compared with R-2R structures.

DETAILED DESCRIPTION OF THE PREFERRED EMBODIMENT

Figure 1:
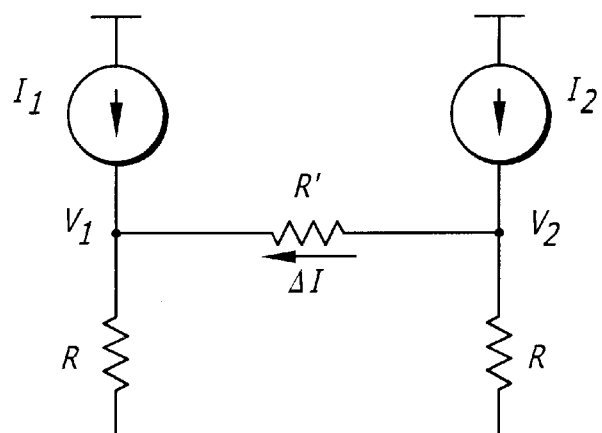
FIG. 1 is a diagram illustrating a simplified architecture of one embodiment of the present invention N-bit DAC.

FIG. 1 is a diagram illustrating a simplified architecture of one embodiment of the present invention N-bit AC. This DAC is composed of two stages. The first stage is an m-bit current steering DAC, represented by currents I1 and I2. The two resistors R are the output resistors used to convert the differential currents I1 and I2 into the differential output voltages V1 and V2. The second stage is a (N−m) bit resistor string DAC, represented by the resistor R'. This resistor string DAC interpolates between the differential output of the first stage (voltages V1 and V2) to generate the output signal.

Figure 2A:
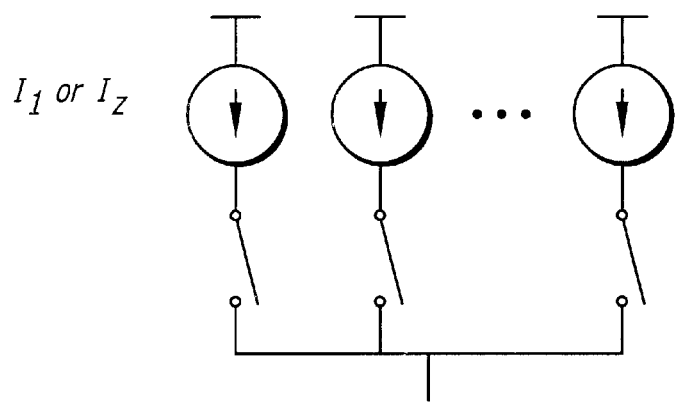
FIG. 2a is a diagram illustrating current steering circuits for generating the currents I1 and I2.

Currents I1 and I2 and their associated resistor R form current steering DACs. The current steering circuits for generating I1 and I2 are illustrated in the diagram of FIG. 2a. The switches are controlled by the top m bits (MSBs) of the input data as decoded by a decoder, not shown in the Figure. Initially, the difference between I1 and I2 is $I_{ref}/2^m$. When the top m bits of the input data changes to the next higher number, the smaller one of the currents I1 and I2 increases by $2I_{ref}/2^m$, and the larger current remains the same. The magnitude of the current difference between I1 and I2 will still be $I_{ref}/2^m$, but what was the smaller current is now the larger current. When the top m bits of the input data changes to the next lower number, the larger one decreases by $2I_{ref}/2^m$, and the smaller current remains the same. Thus the current difference between I1 and I2 is always $I_{ref}/2^m$.

Consider as an example, a replica compensated heterogeneous DAC in accordance with the present invention with the first stage responsive to the first 6 most significant bits. Current sources will be provided for selectively providing currents for I1 ranging from 0 to $64 I_{ref}/64$ in increments of $2I_{ref}/64$, and selectively providing currents for I2 ranging from $I_{ref}/64$ to $63 I_{ref}/64$, also in increments of $2I_{ref}/64$, where $I_{ref}$ is an appropriate reference current. For the lowest value (000000) of the most significant bits, the currents will be controlled so that the current I1=0 and I2=$I_{ref}/64$. For the next lowest value (000001) of the most significant bits, the currents will be controlled so that the current I1=$2I_{ref}/64$ and the current I2=$I_{ref}/64$. For the next value (000010) of the most significant bits, the currents will be controlled so that the current I1=$2I_{ref}/64$ and the current I2=$3I_{ref}/64$, etc.

Figure 2B:
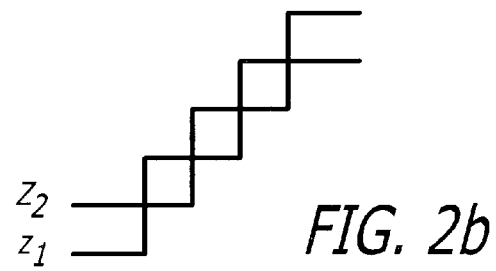
FIG. 2b is an illustration of the alternately changing characteristic in the currents I1 and I2.

Thus the currents I1 and I2 alternately change, as shown in FIG. 2b. The advantage of this operation is that it can reduce DNL (differential non-linearity) during the transitions, since only one of I1 and I2 changes each time (as in a Gray code).

Figure 3:
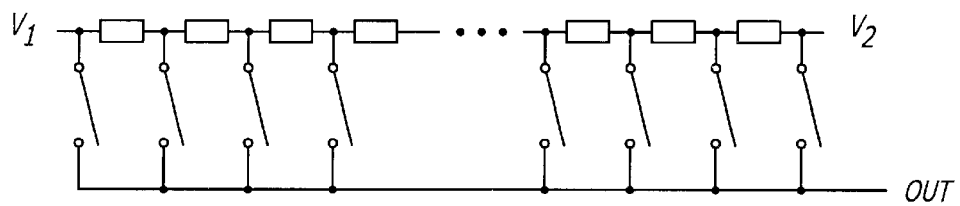
FIG. 3 is a diagram illustrating a resistor string DAC composed of $2^{(N-m)}$ equal resistors with a switch connected to each resistor for interpolation between V1 and V2, represented by the resistor R' of FIG. 1.

The resistor R' is a resistor string DAC composed of $2^{(N-m)}$ equal resistors with a switch connected to each resistor for interpolation between V1 and V2, as shown in FIG. 3. Note that the resistor R' is connected directly between V1 and V2 so as to create a load on the current steering DACs comprised of current source I1 and its associated resistor R, and current source I2 and its associated resistor R. By calculation from FIG. 1:

$$V_1 = \frac{R(R+R')}{(2R+R')}I_1 + \frac{R^2}{(2R+R')}I_2$$

$$V_2 = \frac{R^2}{(2R+R')}I_1 + \frac{R(R+R')}{(2R+R')}I_2$$

$$(V_1 - V_2) = (I_1 - I_2) \cdot \frac{R \cdot R'}{(2R+R')}$$

Figures 4A, 4B:
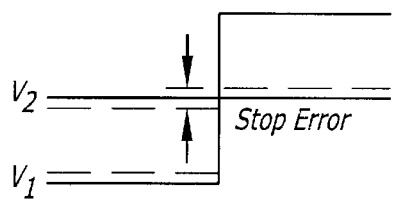
FIG. 4a is an illustration showing that in certain cases, the current in the resistor string drops the voltage V2 and increases the voltage V1.
FIG. 4b is an illustration showing that in other cases, the current in the resistor string drops the voltage V1 and increases the voltage V2.

The consequence of the foregoing is that there is a dependence of $V_2$ on $I_1$ and $V_1$ and $I_2$ due to the existence of the resistor string DAC R'. This phenomenon is referred to herein as the loading effect. Ideally, if the resistance of resistor string R'=∞, then $V_1=I_1R$ and $V_2=I_2R$. However, due to the finite resistance value of the resistor string R', the voltages V1 and V2 differ from these ideal values. If I2>I1, a small part of I2 flows through resistor string R' and the rest of I2 flows through the output resistor on the current I2 side. The current through resistor string R' decreases the current flowing through the output resistor on the I2 current side and increases the current flowing through the output resistor on I1 current side. The current in the resistor string therefore drops the voltage of V2 and increases the voltage of V1, as shown in FIG. 4a. During the next transition, the current I1 increases $2I_{ref}/2^m$ and the current I2 remains the same. Now I1>I2, so the voltage V2 increases above the ideal value and the voltage V1 drops below the ideal value. Ideally during the transition, the voltage V2 should be kept the same as before the transition. The difference between the voltage V2 before the transition and after the transition forms a step error, as shown in FIG. 4b. Although this step error doesn't cause a monotonicity problem, it does cause a DNL error. Therefore it is desirable to eliminate the step error and improve the DNL of the DAC.

Since the loading effect is due to the current flowing through the resistor string R', compensation can be added to eliminate or reduce the loading effect. One compensation scheme that may be used is shown in FIG. 5.

At node V2, $$I_2 + I_{cal} = \frac{V_2}{R} + \frac{V_2 - V_1}{R'}$$

At node V1, $$I_1 + \frac{V_2 - V_1}{R'} = \frac{V_1}{R} + I_{cal}$$

If $$I_{cal} = \frac{V_2 - V_1}{R'},$$

then $$V_1 = I_1 R, \quad V_2 = I_2 R,$$

and $$V_1 - V_2 = (I_1 - I_2)R$$

From the above calculations, it may be seen that by using a pair of compensation currents equal to the current through resistor string R', the voltage V1 will only depend on the current I1, and the voltage V2 will only depend on the current I2. In this way, the loading effect will be eliminated.

Since $$(V_1 - V_2) = (I_1 - I_2)\frac{R \cdot R'}{(2R+R')}$$

and the absolute value of the difference between the currents I1 and I2 is fixed (namely $I_{ref}/2^m$), the magnitude of the voltage difference $V_1-V_2$ is fixed. It is easy to generate a pair of currents with fixed values to compensate for the current through R'.

Figure 6:
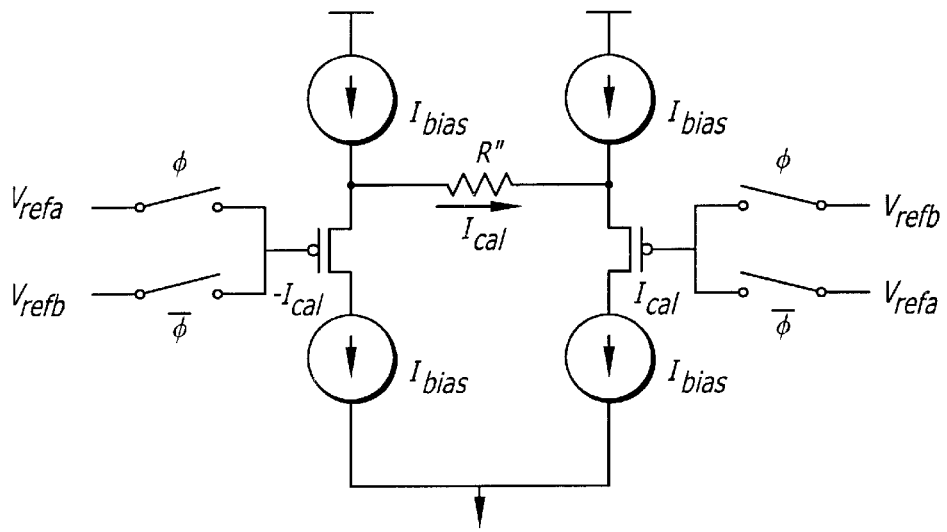
FIG. 6 is a circuit diagram for a replica circuit that may be used to generate the compensation currents for the present invention.

In accordance with this embodiment, a replica circuit is used to generate compensation currents, as shown in FIG. 6. In this circuit, Vrefa and Vrefb are two biasing voltages. If $$Vrefa - Vrefb = Vref / 2^m$$

and the resistor R" is the same resistance as the resistor string DAC resistor R', then the voltage across and the current through the resistor R" (the compensation current Ical) will be equal to the current through the resistor string R'. The switches Φ and $\overline{\Phi}$ controlled by the least significant bit of the most significant bits causes the voltages $V_1$ and $V_2$ to alternately change with the currents I1 and I2 as required (see FIGS. 2b and 5a and 5b.

Figure 5A:
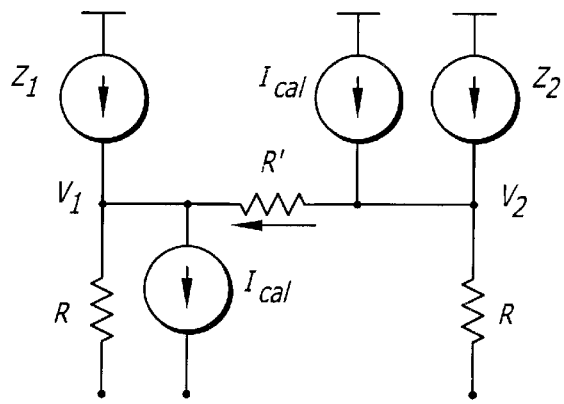
FIGS. 5a and 5b illustrated one compensation scheme that may be used with the present invention.
Figure 5B:
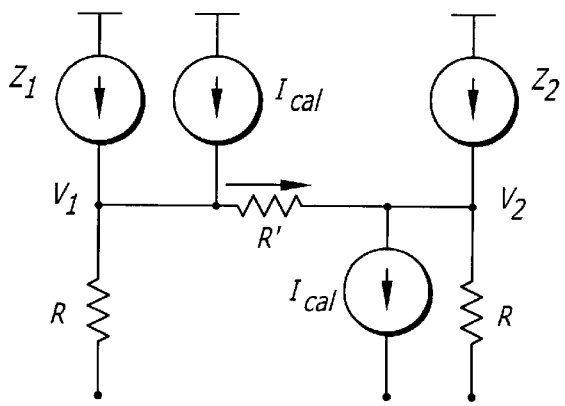
Figure 7:
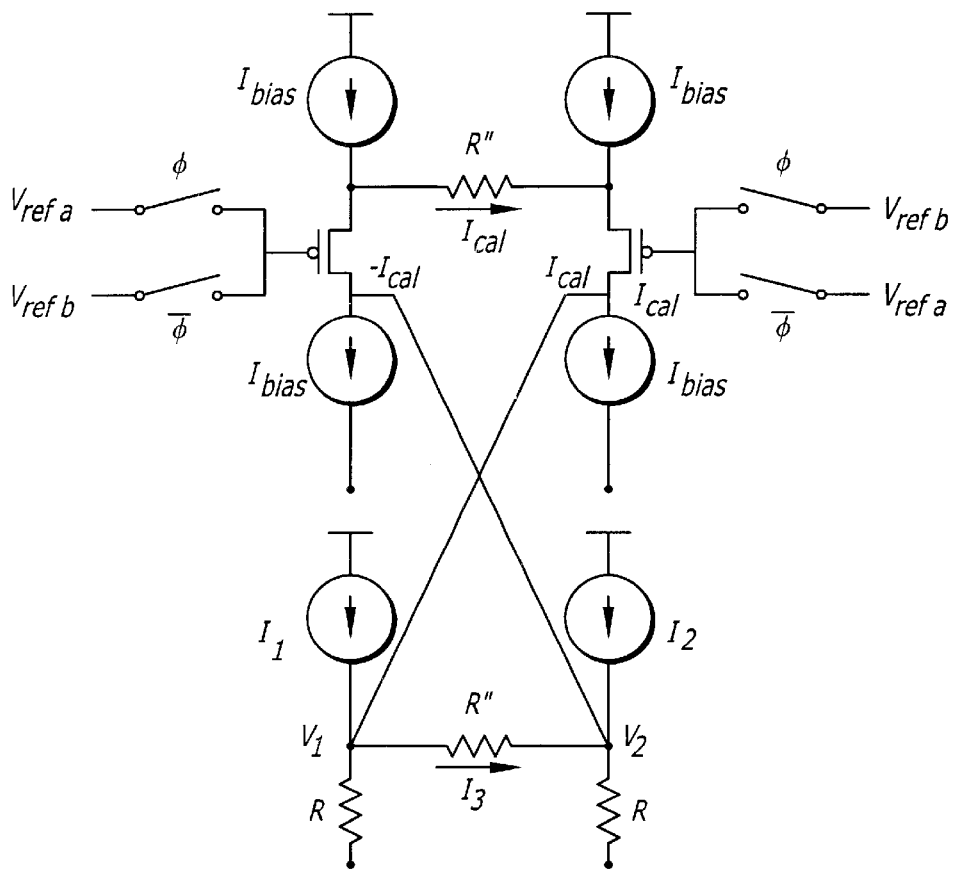
FIG. 7 illustrates how the replica circuit may be connected in the DAC of the present invention.

FIG. 7 illustrates how the replica circuit is connected in the DAC. Since the currents I1 and I2 alternately change, the direction of the compensation currents needs to change accordingly, as shown in FIGS. 5a and 5b. However, because the voltages $V_1$ and $V_2$ alternately change with the currents I1 and I2, the compensation currents will change direction as required by simply maintaining the absolute value of $$Vrefa - Vrefb = Vref / 2^m,$$

and the sign of Vrefa−Vrefb the same as the sign of $V_1-V_2$. In the preferred embodiment, this is done by first generating reference voltages Vrefa and Vrefb, where $$Vrefa - Vrefb = Vref / 2^m,$$

and coupling the reference voltages as appropriate based on the state of the least significant bit of the most significant bits to cause the voltages $V_1$ and $V_2$ to alternately change with the currents I1 and I2.

In the real world, replica circuits tend to have some mismatches, including the mismatch between R" and R' in FIG. 7, the threshold voltage mismatch between the PMOS differential transistor pair M1 and M2 and the mismatch among the four biasing current sources of the replica circuit. Due to the voltage switching scheme, the mismatch of the four biasing currents and the threshold mismatch of the PMOS differential pairs doesn't cause step errors (DNL). Only the mismatch of the resistors and the difference between Vrefa and Vrefb and V1−V2 will cause a step error.

Trimming Vrefa or Vrefb to make (Vrefa−Vrefb)/R"=(V1−V2)/R' will eliminate the step error. Thus only one trim is needed to achieve good DNL and monotonic behavior. By comparison, R-2R DACs need much more trimming to achieve good DNL and monotonicity. Also, one can make $$Vrefa - Vrefb = X * Vref/2^m,$$

and R"=X * R'. This reduces the sensitivity of the circuit such as to errors in Vrefa−Vrefb.

The effect of the mismatch of the four biasing currents and the threshold mismatch of PMOS differential pair will cause INL error, but one trim will eliminate this effect on INL, so that the DAC is capable of high resolution performance.

Figure 8:
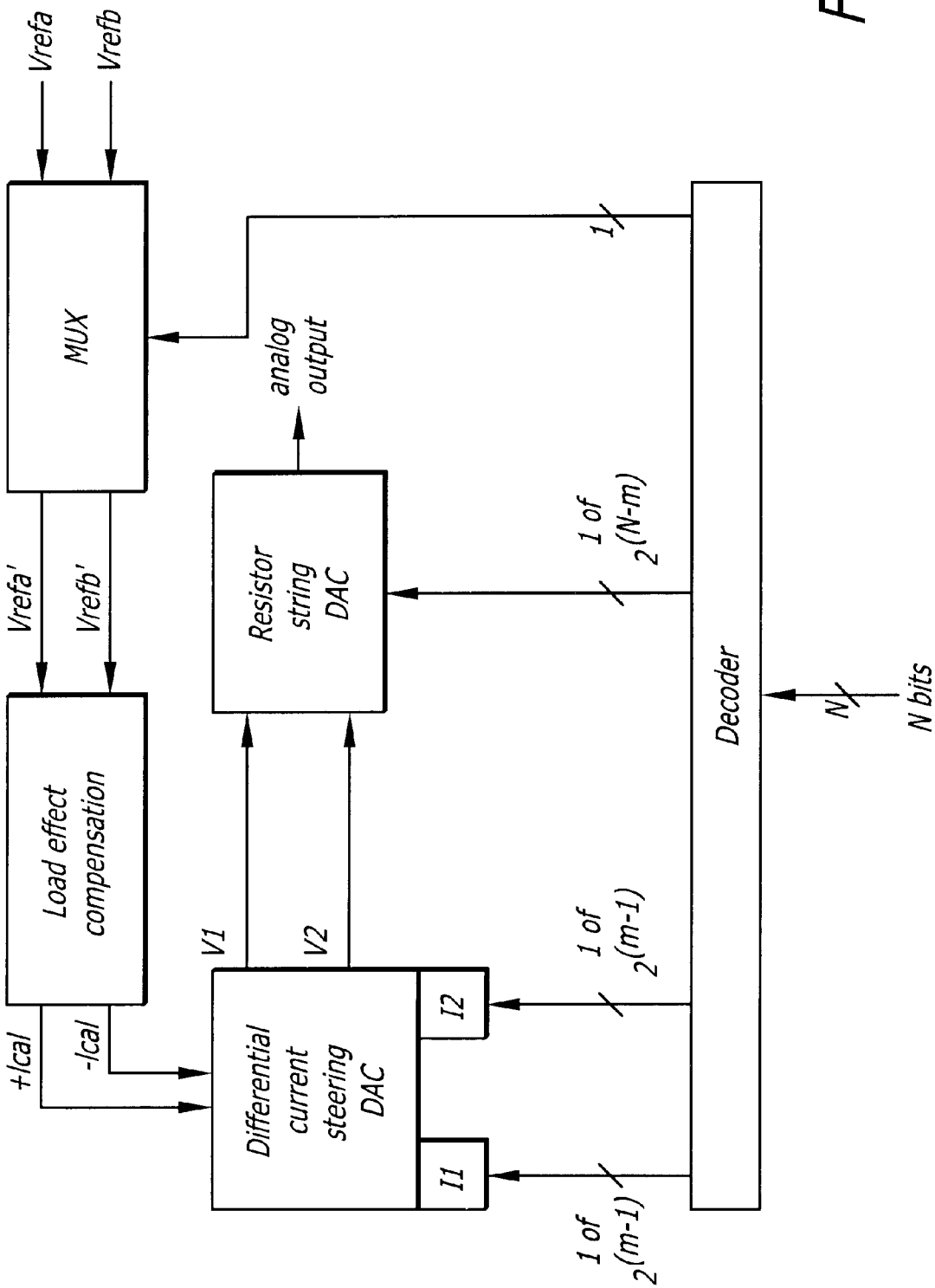
FIG. 8 is a block diagram of a complete replica compensated heterogeneous DAC in accordance with the present invention.

A complete replica compensated heterogeneous DAC is shown in block diagram form in FIG. 8. As shown in this Figure, an N-bit decoder decodes the digital input signal to provide the switch controls for the I1 current steered DAC and the I2 current steered DACs, and the switch controls for the resistor string DAC. For the switches for the I1 current, the least significant bit of the most significant bits need not be decoded, as switching only occurs on even number changes of the most significant bits. The least significant bit of the most significant bits is used however to control the Mux (multiplexer) controlling the direction of injection of the load effect compensation circuit. For the I2 current, one of $2^{(m-1)}$ switch signals is used, with the I1 and I2 current switch increments being adjacent increments, that is, the magnitude of I1−I2 is always $I_{ref}/2^m$. For the decoding for the I2 switches, the decoding for the I1 switches may be used, but with the further refinement of decoding the least significant of the most significant bits to determine whether the current I2 is $I_{ref}/2^m$ more (decode as a 0) or $I_{ref}/2^m$ less (decode as a 1) than the current I1. The remaining $2^{(N-m)}$ bits, the least significant bits of the digital input signal, are decoded subject however to the following. The resistor string DAC interpolates between V1 and V2. Therefore for example, consider a digital input value increasing from all zeros. Initially I2 is greater than I1, so the resistor string DAC is interpolating from V1 toward V2. However when the least significant bits roll over and the least significant bit of the most significant bits changes to a 1, the current I1 and thus the voltage V1 is incremented so that now the voltage V1 exceeds the voltage V2. Now the resistor string DAC must interpolate from the voltage V2 toward the voltage V1 for the increasing input signal.

There are various ways of accomplishing this. One way would be to swap the resistor string tap (output) switches end for end on the resistor string on rollover of the least significant bits, but this would require a lot of switches. An alternative would be to simply swap the ends of the resistor string itself on least significant bit rollover, so that one end of the resistor string was always the lower voltage end and the other end the higher voltage end. This requires many fewer switches.

In a preferred embodiment, switches are provided between each pair of resistors in the resistor string, and at each end of the resistor string as shown in FIG. 3. Thus for the N−m least significant bits, there are $2^{(N-m)}$ resistors in the resistor string and $2^{(N-m)}+1$ total tap switches. One end of the resistor string is permanently connected to V1, and the other end of the resistor string is permanently connected to V2. The least significant bits are decoded in a normal manner to count up from the low voltage end of the resistor string (for an increasing digital signal) to determine which switch to turn on, with the switch at the high voltage end always being off for any least significant bit code. The least significant bit of the most significant bits as decoded determines which end of the resistor string is at the higher voltage, and thus determines from which end of the resistor string the decoded least significant bits will count from. In any event, the current steering DAC provides the voltages V1 and V2 to the resistor string DAC for interpolation to provide the analog output. Load compensation may be generated from the Vrefa and Vrefb voltages by generating the calibration currents +Ical and −Ical as described. Of course, other compensation schemes may be used as desired.

While certain preferred embodiments of the present invention have been disclosed herein, such disclosure is only for purposes of understanding exemplary embodiments and not by way of limitation of the invention. It will be obvious to those skilled in the art that various changes in form and detail may be made in the invention without departing from the spirit and scope of the invention as set out in the full scope of the following claims.

What is claimed is:

1. A heterogeneous digital to analog converter (DAC) for converting a multiple bit digital input to an analog output comprising:
   a differential segmented current DAC providing a differential output; and,
   a resistor string DAC coupled to the differential output of the differential segmented current DAC to interpolate between the differential output of the differential segmented current DAC to provide the analog output.

2. The heterogeneous DAC of claim 1 wherein the resistor string DAC is coupled directly to the differential output of the differential segmented current DAC without an amplifier therebetween.

3. The heterogeneous DAC of claim 2 further comprising a compensation circuit canceling the effect of the current loading of the resistor string DAC on the differential segmented current DAC.

4. The heterogeneous DAC of claim 3 wherein the compensation circuit comprises a current replicating circuit to replicate the current of the resistor string DAC for injection to cancel the effect of the current loading of the resistor string DAC on the differential segmented current DAC.

5. The heterogeneous DAC of claim 1 wherein the differential segmented current DAC is comprised of first and second current DACs, the first current DAC having a first current source providing a first current through a first resistor, the second current DAC having a second current source providing a second current through a second resistor.

6. The heterogeneous DAC of claim 5 wherein the first and second current sources provide currents which always differ by the same amount.

7. The heterogeneous DAC of claim 6 wherein the first and second current sources alternately increase and decrease, respectively, for increases and decreases, respectively, of the value in the digital input.

8. The heterogeneous DAC of claim 7 wherein the resistor string DAC is connected directly between the first and second resistors without an amplifier therebetween.

9. The heterogeneous DAC of claim 8 further comprising a compensation circuit canceling the effect of the current loading of the resistor string DAC on the differential segmented current DAC.

10. The heterogeneous DAC of claim 9 wherein the compensation circuit comprises a current replicating circuit to replicate the current of the resistor string DAC for injection to cancel the effect of the current loading of the resistor string DAC on the differential segmented current DAC.

11. A heterogeneous digital to analog converter (DAC) for converting an N bit digital input to an analog output comprising:
- a decoder;
- a differential segmented current DAC coupled to the decoder and providing a differential output corresponding to the decoding of the m most significant bits of the N bit digital input; and,
- a resistor string DAC coupled to the differential output of the differential segmented current DAC and to the decoder to interpolate between the differential output of the differential segmented current DAC responsive to the decoding of the N−m least significant bits of the N bit digital input to provide the analog output.

12. The heterogeneous DAC of claim 11 wherein the resistor string DAC is coupled directly to the differential output of the differential segmented current DAC without an amplifier therebetween.

13. The heterogeneous DAC of claim 12 further comprising a compensation circuit canceling the effect of the current loading of the resistor string DAC on the differential segmented current DAC.

14. The heterogeneous DAC of claim 13 wherein the compensation circuit comprises a current replicating circuit to replicate the current of the resistor string DAC for injection to cancel the effect of the current loading of the resistor string DAC on the differential segmented current DAC.

15. The heterogeneous DAC of claim 11 wherein the differential segmented current DAC is comprised of first and second current DACs, the first current DAC having a first current source providing a first current through a first resistor, the second current DAC having a second current source providing a second current through a second resistor.

16. The heterogeneous DAC of claim 15 wherein the first and second current sources provide currents which always differ by an amount corresponding to the value of the least significant of the most significant bits of the N bit digital input.

17. The heterogeneous DAC of claim 16 wherein the first and second current sources alternately increase and decrease, respectively, for increases and decreases, respectively, of the value of the digital input.

18. The heterogeneous DAC of claim 17 wherein the resistor string DAC is connected directly between the first and second resistors without an amplifier therebetween.

19. The heterogeneous DAC of claim 18 wherein the resistor string DAC is comprised of $2^{(N-m)}$ resistors and $2^{(N-m)}+1$ switches, each of $2^{(N-m)}-1$ switches being coupled between a respective node between adjacent resistors in the resistor string and the analog output, each of the remaining two switches being coupled between a respective end of the resistor string and the analog output.

20. The heterogeneous DAC of claim 19 wherein the decoder turns on one switch of a group of $2^{(N-m)}$ switches responsive to the decoder decoding the N−m least significant bits of the N bit digital input, the $2^{(N-m)}$ switches including the $2^{(N-m)}-1$ switches coupled between a respective node between adjacent resistors in the resistor string and the analog output, and the switch at one of the two ends of the resistor string dependent on the decoding of the least significant of the m most significant bits of the N bit digital input.

21. The heterogeneous DAC of claim 17 further comprising a compensation circuit canceling the effect of the current loading of the resistor string DAC on the differential segmented current DAC.

22. The heterogeneous DAC of claim 21 wherein the compensation circuit comprises a current replicating circuit to replicate the current of the resistor string DAC for injection to cancel the effect of the current loading of the resistor string DAC on the differential segmented current DAC.

23. The heterogeneous DAC of claim 22 wherein the current replicating circuit is a circuit responsive to the relative magnitudes of the first and second current sources to determine the direction of injection of the replicated current of the resistor string DAC.

24. A heterogeneous digital to analog converter (DAC) for converting an N bit digital input to an analog output comprising:
- a decoder;
- a differential segmented current DAC coupled to the decoder and providing a differential output corresponding to the decoding of the m most significant bits of the N bit digital input;
- a resistor string DAC coupled to the differential output of the differential segmented current DAC without amplifiers therebetween, and to the decoder to interpolate between the differential output of the differential segmented current DAC responsive to the decoding of the N−m least significant bits of the N bit digital input to provide the analog output; and,
- a compensation circuit canceling the effect of the current loading of the resistor string DAC on the differential segmented current DAC.

25. The heterogeneous DAC of claim 24 wherein the compensation circuit comprises a current replicating circuit to replicate the current of the resistor string DAC for injection to cancel the effect of the current loading of the resistor string DAC on the differential segmented current DAC.

26. The heterogeneous DAC of claim 25 wherein the current replicating circuit is a circuit responsive to the relative magnitudes of the first and second current sources to determine the direction of injection of the replicated current of the resistor string DAC.

27. The heterogeneous DAC of claim 26 wherein the differential segmented current DAC is comprised of first and second current DACs, the first current DAC having a first current source providing a first current through a first resistor, the second current DAC having a second current source providing a second current through a second resistor.

28. The heterogeneous DAC of claim 27 wherein the first and second current sources provide currents which always differ by a predetermined amount.

29. The heterogeneous DAC of claim 28 wherein the first and second current sources alternately increase and decrease, respectively, for increases and decreases, respectively, of the value of the digital input.

30. The heterogeneous DAC of claim 29 wherein the resistor string DAC is comprised of $2^{(N-m)}$ resistors and $2^{(N-m)}+1$ switches, each of $2^{(N-m)}-1$ switches being coupled between a respective node between adjacent resistors in the resistor string and the analog output, each of the remaining two switches being coupled between a respective end of the resistor string and the analog output.

31. The heterogeneous DAC of claim 30 wherein the decoder turns on one switch of a group of $2^{(N-m)}$ switches responsive to the decoder decoding the N−m least significant bits of the N bit digital input, the $2^{(N-m)}$ switches including the $2^{(N-m)}-1$ switches coupled between a respective node between adjacent resistors in the resistor string and the analog output, and the switch at one of the two ends of the resistor string dependent on the decoding of the least significant of the m most significant bits of the N bit digital input.

32. The heterogeneous DAC of claim 31 wherein the current replicating circuit is a circuit responsive to the relative magnitudes of the first and second current sources to determine the direction of injection of the replicated current of the resistor string DAC.

33. A method of converting an N bit digital signal to an analog output comprising:
  converting the m most significant bits to a differential output using a differential segmented current DAC;
  coupling a resistor string DAC directly to the differential output without an amplifier therebetween;
  canceling the effect of the current loading of the resistor string DAC on the differential segmented current DAC; and,
  using the resistor string DAC, interpolating the differential output using the N−m least significant bits of the N bit digital input to provide the analog output.

34. The method of claim 33 wherein the canceling is done by replicating the current of the resistor string DAC and injecting the replicated current to cancel the effect of the current loading of the resistor string DAC on the differential segmented current DAC.

35. The method of claim 34 wherein the differential segmented current DAC used is comprised of first and second current DACs, the first current DAC having a first current source providing a first current through a first resistor, the second current DAC having a second current source providing a second current through a second resistor.

36. The method of claim 35 wherein the first and second current sources provide currents which always differ by a predetermined amount.

37. The method of claim 36 wherein the first and second current sources are alternately increased and decreased, respectively, for increases and decreases, respectively, of the value of the m most significant bits of the N bit digital input.

38. The method of claim 37 wherein the decoder causes the smaller of the current sources to increase for increasing values of the N bit digital input, and the larger of the current sources to decrease for decreasing values of the N bit digital input.

39. The method of claim 38 wherein the resistor string DAC is comprised of $2^{(N-m)}$ resistors and $2^{(N-m)}+1$ switches, each of $2^{(N-m)}-1$ switches being coupled between a respective node between adjacent resistors in the resistor string and the analog output, each of the remaining two switches being coupled between a respective end of the resistor string and the analog output, and wherein the decoding of the least significant bits of the N bit digital input for increasing values of the N bit digital input determines which switch is turned on by counting up from the end of the resistor string which is at the lowest voltage.

* * * * *